United States Patent [19]
Kobayashi et al.

[11] Patent Number: 5,768,570
[45] Date of Patent: Jun. 16, 1998

[54] DELAY TIME STABILIZATION CIRCUIT

[75] Inventors: Minoru Kobayashi; Shinichiro Kuroe, both of Saitama, Japan

[73] Assignee: Advantest Corp., Tokyo, Japan

[21] Appl. No.: 638,947

[22] Filed: Apr. 24, 1996

[30] Foreign Application Priority Data

Apr. 24, 1995 [JP] Japan .................................. 7-123171

[51] Int. Cl.⁶ ............................................... G06F 11/22
[52] U.S. Cl. ........................... 395/552; 364/490; 395/557
[58] Field of Search ................................. 395/555, 557, 395/552; 364/480, 481, 486, 487, 490, 550; 371/22.1, 22.5, 22.6, 27

[56] References Cited

U.S. PATENT DOCUMENTS

| | | |
|---|---|---|
| 5,039,893 | 8/1991 | Tomisawa .............................. 327/276 |
| 5,179,438 | 1/1993 | Morimoto .............................. 348/536 |
| 5,488,325 | 1/1996 | Sato et al. ............................. 327/286 |

*Primary Examiner*—Thomas M. Heckler
*Attorney, Agent, or Firm*—Muramatsu & Associates

[57] ABSTRACT

A delay time stabilization circuit is used in a timing generator which provides a reference timing of a semiconductor IC test system. The delay time stabilization circuit includes a delay control circuit, a period generator which generates period signals necessary for DUT (device under test) testing, a loop forming switch, and a period counter 31 for counting the period in a loop circuit. The calibration process starts by setting the loop forming switch. A start pulse generation circuit generates n pulses when receiving one trigger pulse which pass through a CMOS variable delay circuit and the loop circuit to a 1/n divider circuit. The n pulses are divided by n to produce a signal pulse which triggers the start pulse generation circuit. In the DUT testing, the period generator 11 generates the period signal necessary for the testing which is the same repetition rate as generated by the start pulse generation circuit, resulting in the same power dissipation in the calibration process and the DUT testing.

6 Claims, 5 Drawing Sheets

DELAY TIME STABILIZATION CIRCUIT

FIELD OF THE INVENTION

The present invention relates to a delay-time stabilization circuit for a timing generation circuit which functions as a reference timing generator of a semiconductor IC test system.

BACKGROUND OF THE INVENTION

In general, a timing calibration is performed in a semiconductor IC test system (hereafter IC tester) prior to the start of the test. When testing an IC device to be tested (hereafter DUT), the following errors are occurred due to the difference in the frequency conditions between the calibration process and the actual testing.

The reason for the errors is that the difference of the delay periods in a timing generation circuit causes a temperature difference in an area surrounding a group of CMOS gates which form the timing generation circuit.

FIG. 5 shows a block diagram of a timing generator in a semiconductor test system.

The timing generator of FIG. 5 includes a period generator 10 that generates a designated test period for testing a DUT, a delay control circuit 80 that controls the delay time of a delay generation circuit 100, a wave formatter 110 which produces a test waveform by combining logic data and timing pulses, and a pin electronics 120 which is a test circuit connected to each pin of the DUT to test the pin.

In testing the DUT, the timing generator functions to causes one pattern, i.e., one operation of the semiconductor test system corresponding to the cycle time of the DUT. In such a timing generator, there is an unstable element in CMOS gates which form the timing generator circuit 100, since the changes in the ambient temperature causes changes in the delay times.

A delay circuit in the timing generator 100 typically includes a CMOS semiconductor IC chip in an integrated circuit. The delay time of the CMOS gates changes because of the rise of inner temperature is dependent on the operation frequency.

Stabilizing the delay time in the timing generation circuit is required to improve precision and accuracy in the DUT testing. Several attempts have been made to achieve this goal.

In general, the stabilization attempts are made against the fluctuation of the delay time in the gates by temperature changes such as in CMOS and BI-CMOS ICs.

Many conventional technologies attempt to control the surrounding temperature of the semiconductor IC chips such as CMOS and BI-CMOS so that the working temperature for ICs such as CMOS and BI-CMOS will not fluctuate, thereby keeping a signal propagation delay time to a constant level.

Thus, a temperature sensor and a heater are provided to control the internal temperature of the IC to adjust its surrounding temperature. As an example, refer to Japanese Patent Laying-Open No. 1989-114067. FIG. 6 shows a schematic view of the temperature correction circuit in the conventional art.

As shown in FIG. 6, a temperature sensor and a heater surround an IC gate such as CMOS and BI-CMOS through which a delay signal passes. The internal temperature of the IC is controlled to keep the surrounding temperature constant.

The other method that does not use a temperature sensor or a heater tries to keep the surrounding temperature constant by controlling the operation frequency using the characteristic of the CMOS gate in which the amount of heat dissipation changes dependent on the operation frequency.

When the delay circuit is formed of CMOS gates, there is a fixed relationship between an operation frequency and the amount of heat dissipation.

When the amount of heat dissipation is represented by p, and the operation frequency is represented by f, the relationship between the two is expressed as p=K×f (where K is a proportional constant).

An example of the conventional technology which uses this characteristics in changing the amount of heat dissipation by the operation frequency is explained with reference to the drawings. FIG. 4 shows an embodiment of CMOS variable delay circuit in this kind of conventional technology.

A dummy CMOS gate 68 is provided which surrounds the CMOS gate 61 in a CMOS or BI-MOS IC through which a delay signal passes. A reference clock which functions as a operational reference of an overall semiconductor test system is input to the dummy CMOS gate 68 through an AND gate 66 so that the dummy CMOS gate 68 is heated.

This circuit is so structured that when the CMOS gate 61 which produces a delay time is supplied with an input signal through an AND gate 64, the reference clock is not supplied to the dummy AND gate 68 at this timing.

When a pulse is input at a point "a" of FIG. 4, the reference clock at a point "c" is not input. When the pulse is not input at the point "a", the point "c" receives the reference clock through the AND gate 66, and the heat corresponding to the reference clock is generated in the dummy CMOS gate 68.

An example of a delay generator 100 using a CMOS variable delay circuit 60 is explained with reference to FIG. 3.

Test signals are provided to many pins of the DUT. The timings of the test signals must be identical, and thus, the timings are calibrated at the initiation of the test or whenever necessary to confirm the timings.

FIG. 8(A) is a timing chart showing an operation of the timing calibration in the conventional delay time stabilization circuit.

At the start of the calibration operation, a loop forming switch 50 for diagnosis is turned to "1". A start pulse oscillator 20 outputs a predetermined pulse which is input to a CMOS variable delay circuit 60 though an OR gate 40. The output of CMOS variable delay circuit 60 is feed-backed though a loop circuit 70.

A constant repetition signal is obtained at an output by repeating this operation of returning the signal after passing through the loop circuit 70.

A time period is measured by a period measurement counter 30. A delay control circuit 80 controls the CMOS variable delay circuit 60 so that the time period becomes a predetermined value.

FIG. 8 (B) is a timing chart showing an operation of the delay time stabilization circuit when testing the DUT.

In the actual testing, the loop-forming switch 50 for diagnosis is turned to "2". The delay time of the CMOS variable delay circuit 60 which receives a predetermined period signal from a period signal generator 10 is controlled the delay time by the delay control circuit 80 and outputs the period signal to the next stage.

The relationship between the delay time in the CMOS variable delay circuit 60 and the chip temperature is expressed as 0.3%/°C. Thus, when the oscillation period is, for example, around 150 ns in the loop oscillation calibration, and an operation frequency in the actual DUT test is 10 ns, the amount of the heat dissipation between the two situations is different more than 10 times, thereby causing errors in the delay time.

The dummy CMOS gates are used in order to attain the amount of heat dissipation, which requires the CMOS variable delay circuit additional ICs for the dummy CMOS gates. Since an IC chip of twice as large as that actually required for the variable delays, there is a disadvantage that it increases a cost and an electric consumption. There is a need to achieve a stable operation with the minimum required CMOS gates.

In the calibration process, there is a problem when the operation frequency in the actual DUT test is 10 ns whereas the oscillation frequency in the calibration is 100 ns, which results in ten times difference in the amount of heat dissipation therebetween which causes delay time errors.

SUMMARY OF THE INVENTION

An object of the present invention is to provide a CMOS variable delay circuit which has a circuit configuration that will not produce a difference in temperature in the calibration process and the actual DUT test without using dummy CMOS gates.

In order to achieve the above objective, the CMOS variable delay circuit of the present invention includes means which does not require dummy CMOS gates for attaining the amount of heat dissipation.

Further, the variable delay circuit is provided with a circuit arrangement which does not cause a difference in temperature between the calibration process of the CMOS variable delay circuit and the actual DUT testing.

The variable delay circuit also includes means for generating a predetermined number of pulses by one input trigger pulse and means for generating a signal pulse when inputting n pulses.

In order suppress the temperature difference between the calibration process and the actual testing, the above noted CMOS variable delay circuit generates 1/n pulses through a 1/n divider circuit when the 1/n divider circuit receives pulses from a start pulse generator which generates n pulses in response to one trigger pulse. Thus, the number of pulses in the calibration process and the actual DUT testing become the same, as a result of which the amounts of heat dissipation in the CMOS gates become constant.

In the actual DUT testing, when the testing is operated, for example, at 10 ns, then the amount of heat dissipation in the CMOS circuit 71 becomes identical by performing the calibration process at 10 ns.

For example, when the frequency of the loop circuit 71 is 180 ns for instance, a pulse interval of the start pulse is set to 10 ns. The pulse interval becomes identical to the 10 ns operation period by introducing the start pulses to the 1/n divider circuit. Thus, the error will be minimized because of the identical conditions of heat dissipation are attained in the calibration process and the actual DUT testing.

BRIEF DESCRIPTION OF THE DRAWINGS

FIG. 8 (B) is a timing chart showing operation of the actual DUT testing under the conventional delay time stabilization circuit.

DETAILED DESCRIPTION OF THE INVENTION

Figure 1:
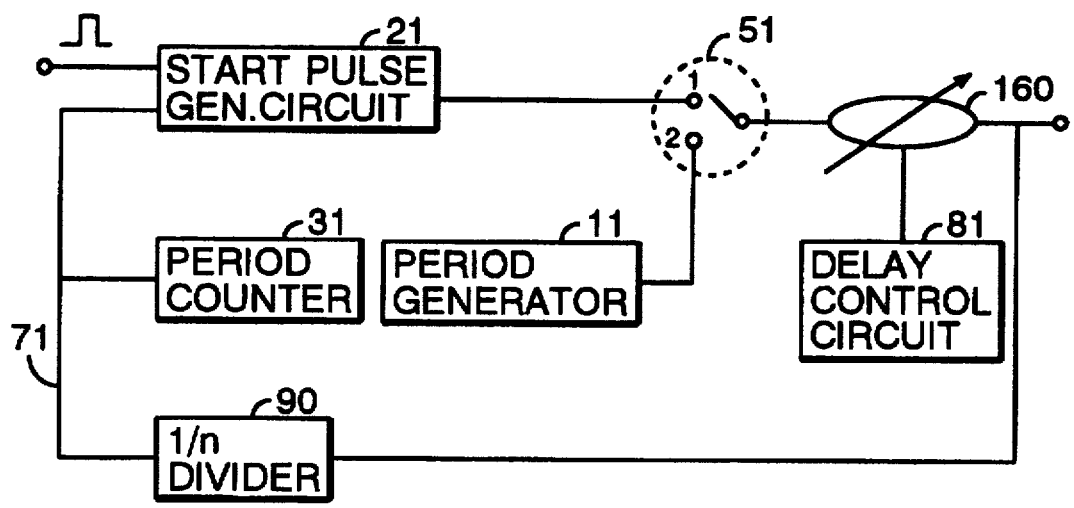
FIG. 1 is a block diagram showing an embodiment of a delay time stabilization circuit in accordance with the present invention.
Figure 2:
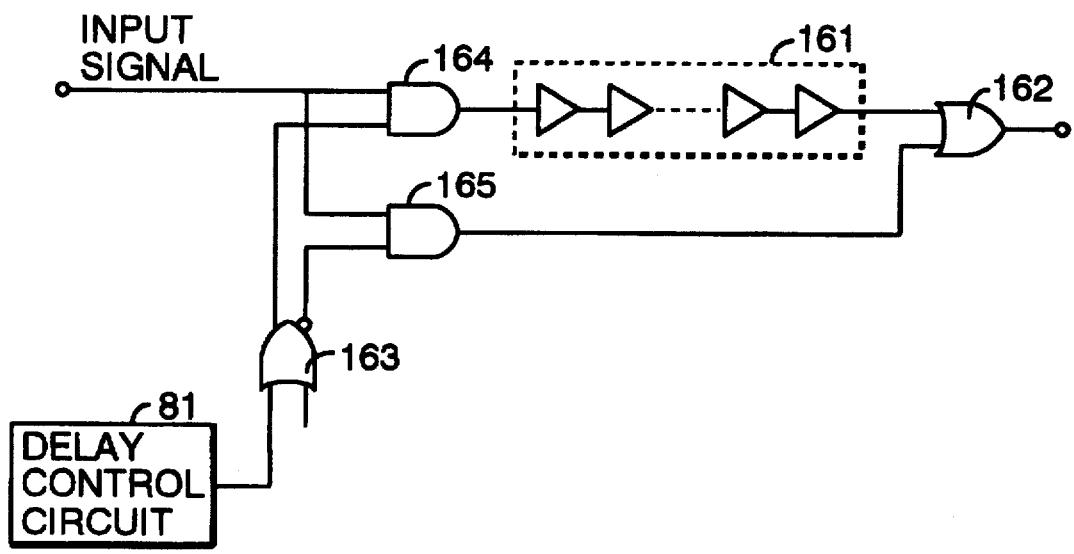
FIG. 2 is a block diagram showing the CMOS variable delay circuit.
Figure 3:
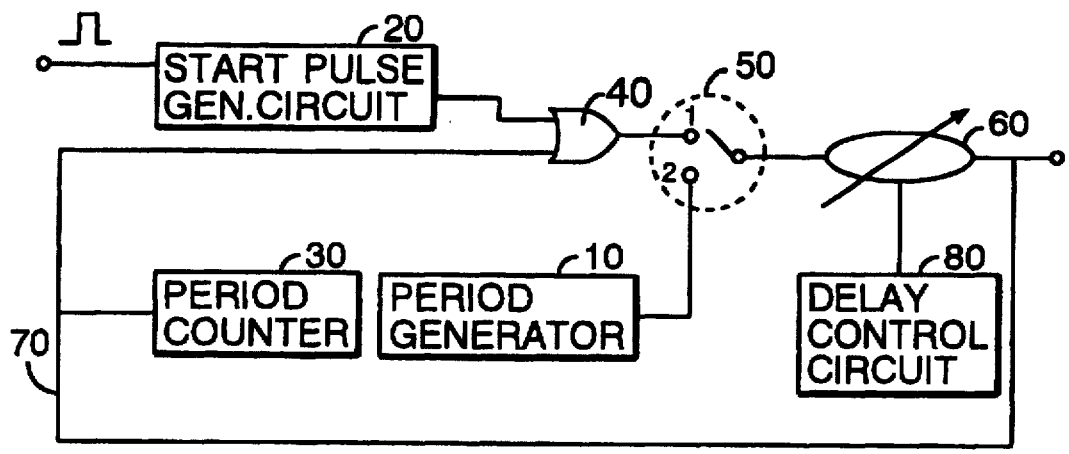
FIG. 3 is a block diagram of a conventional example of delay generator.
Figure 4:
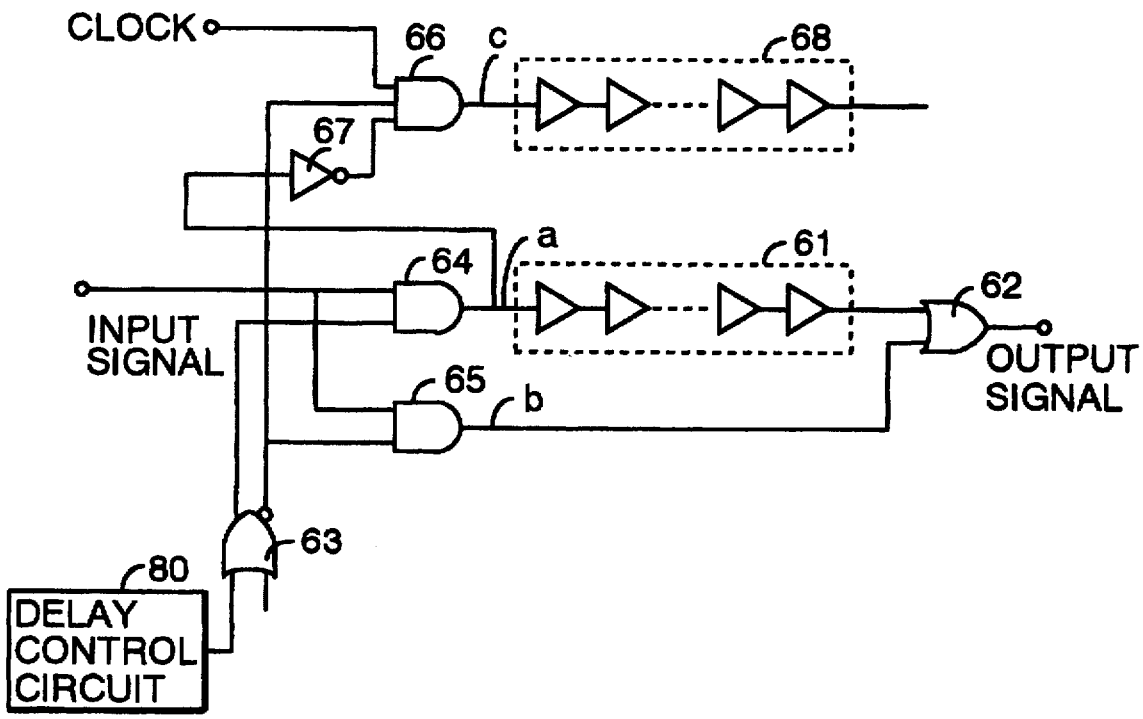
FIG. 4 is a block diagram of a conventional example of CMOS variable delay circuit.
Figure 5:
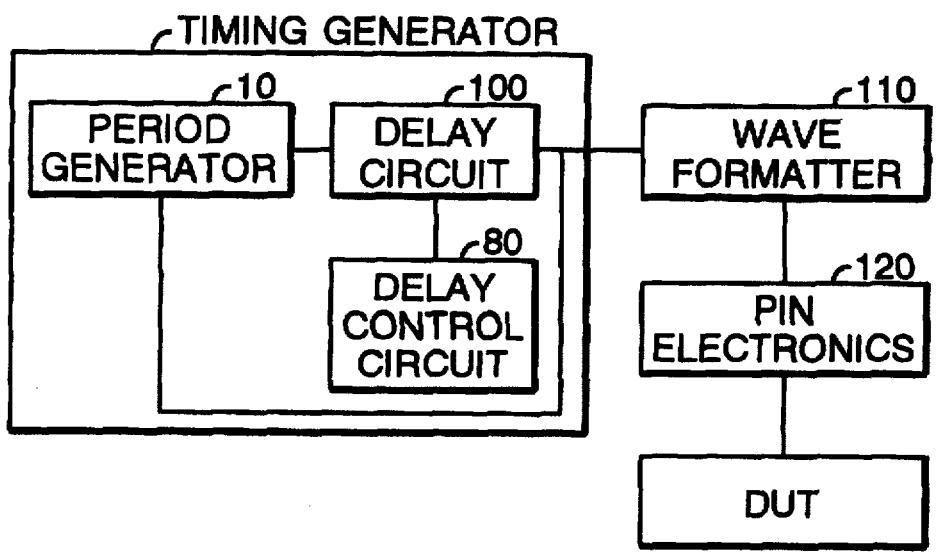
FIG. 5 is a block diagram of a conventional example of timing generator for a semiconductor test system.
Figure 6:
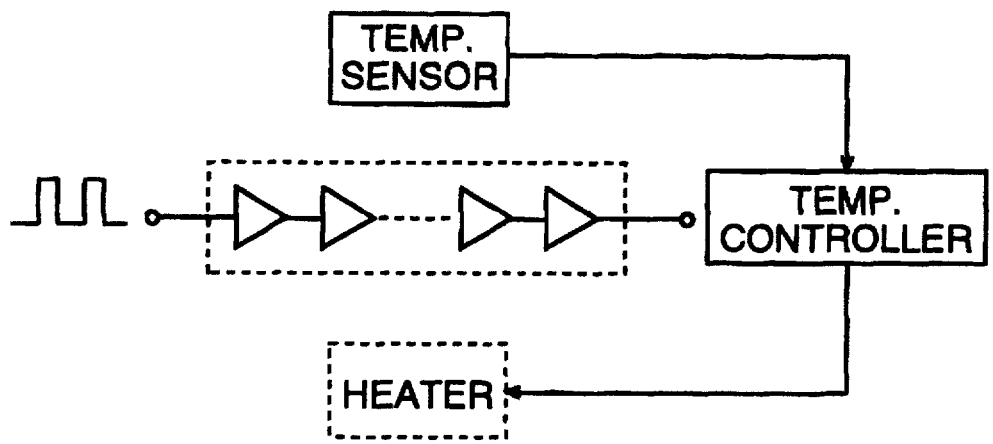
FIG. 6 is a schematic view of a conventional example of temperature calibration circuit.
Figure 7:
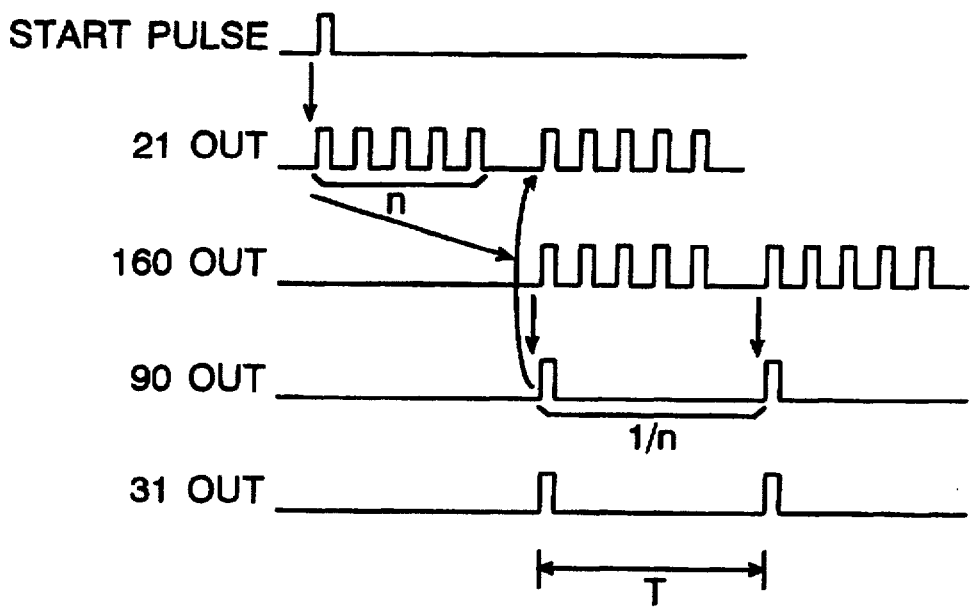
FIG. 7 is a timing chart of delay time stabilization circuit of the present invention.
Figure 8A:
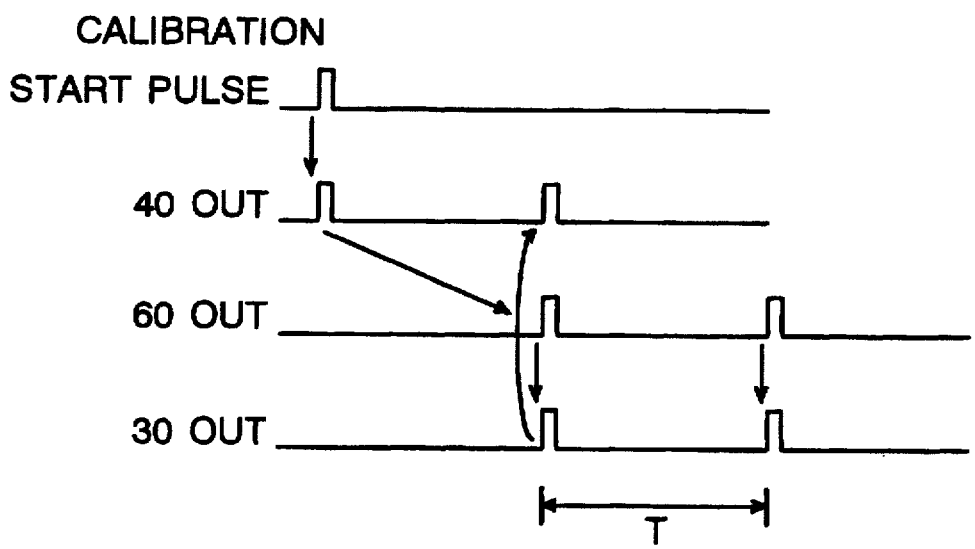
FIG. 8 (A) is a timing chart showing an operation of the conventional delay time stabilization circuit.
Figure 8B:
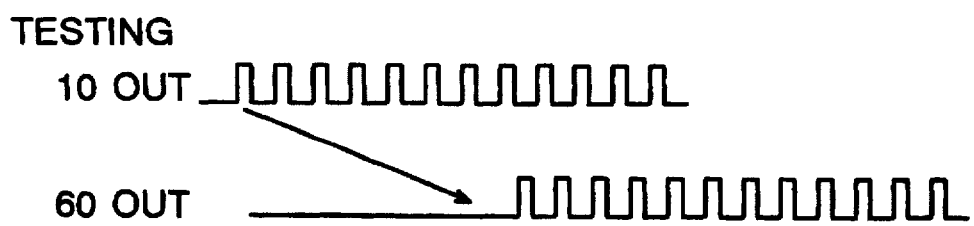

An embodiment of the present invention is explained with reference to the drawings. FIG. 1 shows an embodiment of a delay time stabilization circuit of the present invention. FIG. 2 shows a CMOS variable delay circuit. FIG. 7 is a timing chart of the delay time stabilization circuit of the present invention.

The CMOS variable delay circuit 160 receives a predetermined output of a period generator 11 when actual testing is initiated by turning the diagnosis loop-forming switch 51 to "2". This switch is to change between the calibration process and the actual testing. The CMOS variable delay circuit 160 is controlled by a delay control circuit 81 and sends the delayed signal to the next stage.

The calibration is performed by turning the diagnosis loop-forming switch 51 to "1". The CMOS variable delay circuit 160 receives an output signal of a start pulse generation circuit 21 which generates a predetermined number of pulses in response to one trigger pulse. The CMOS variable delay circuit 160 provides the signal from the start pulse generation circuit to a 1/n divider circuit 90 which is provided between the variable delay circuit 160 and a loop circuit 71. The 1/n divider circuit 90 divides the n pulses which pass therethrough into a single pulse. The period of the output pulses from the divider circuit 90 is detected by a period counter 31. The loop circuit 71, the end terminal of which is connected to the start pulse generation circuit 21, is a closed loop circuit which causes a constant frequency signal oscillation.

FIG. 2 shows a CMOS variable delay circuit which is deleted the dummy CMOS gate provided in the conventional technology to generate heat.

The delay control circuit 81, which controls the delay time, inputs a control signal to AND gates 164 and 165 through a NOR gate 163. The AND gate 165 is connected to an OR gate 162. An input signal is connected to each of the AND gates 164 and 165.

A series of CMOS gates 161 which is to produce a propagation delay receives the input signal through the AND gate 164. The OR gate 162 outputs the delayed signal.

Figure 9:
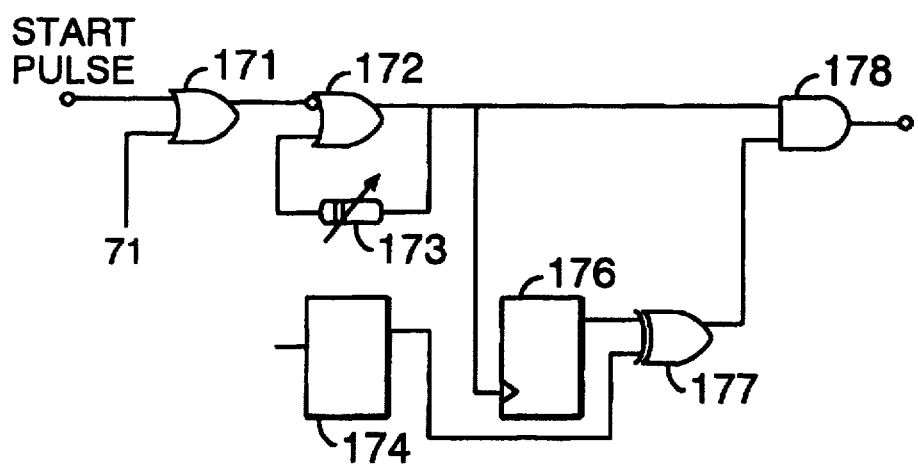
FIG. 9 is a block diagram showing an example of start pulse generation circuit in the embodiment of the present invention of FIG. 1.

FIG. 9 is a block diagram showing an example of the start pulse generation circuit under the present invention. Through an OR gate 171, a start pulse initiates an oscillation circuit which is comprised of an OR gate 172 and a delay element 173. By adjusting the delay time of this oscillation circuit, an operation frequency of actual DUT testing, for example, 10 ns period, is generated. A register 174 is provided with "n" which is compared, at a coincidence circuit 177, with a number of pulses measured by a counter 176. When both of the data coincide, a coincidence signal is generated from the coincidence circuit 177, thereby closing an AND gate 178 to prevent the oscillation signal from being sent to the loop circuit. For instance, when the time period of the loop circuit 71 is 180 ns, the value n given to the register 174 is set to "18". The oscillation in the oscillation circuit is stopped by the coincidence signal from the coincidence circuit 177 when 18 pulses are counted by the counter 176, and the next oscillation is initiated by a signal returning from the loop circuit 71.

The present invention achieves the following advantages because of the above described structure.

The size of the IC necessary is decreased to half by eliminating the dummy CMOS gates in the conventional technology, thereby decreasing the electric consumption and the cost of dummy CMOS gates.

There is no difference in the temperature between the calibration process and the actual DUT testing and thus no error of delay time because the 1/n divider circuit is provided and the circuit composition of the start pulse generation circuit in the loop circuit is changed, and thus the number of signals passing through the CMOS adjustable delay circuit in the calibration process and the actual DUT testing are equalized.

What is claimed is:

1. A delay time stabilization circuit for a semiconductor test system, comprising:

a loop forming switch (51) for forming a closed signal loop during a calibration process and opening said closed signal loop during an actual testing process in said semiconductor test system;

a delay control circuit (81) for controlling a delay time in a CMOS variable delay circuit (160) whose delay time is to be stabilized;

a period counter (31) for counting a period of a signal oscillated in said closed signal loop formed by said switch (51);

a start pulse generation circuit (21) which provides n pulses to said closed signal loop every time when receiving a trigger pulse;

said CMOS variable delay circuit (160) receives said n pulses to delay said n pulses by the delay time defined by said delay control circuit (81); and a 1/n divider circuit (90) which receives said n pulses from said CMOS variable delay circuit (160) to divide said pulses by n;

wherein said start pulse generation circuit (21) receives a start pulse at the start of said calibration process as said trigger pulse, and thereafter, an output pulse of said 1/n divider circuit (90) as said trigger pulse.

2. A delay time stabilization circuit as defined in claim 1, wherein said CMOS variable delay circuit comprises:

a pair of AND gates (164, 165) which commonly receive an output signal from said loop forming switch (51);

a NOR gate (163) which provides an inverted delay control signal to one of said AND gates (164) and a non-inverted delay control signal to the other AND gate (165); and an OR gate (162) which receives an output signal from said other AND gate (165).

3. A delay time stabilization circuit as defined in claim 1, wherein said closed signal loop is comprised of a signal pass connecting said start pulse generation circuit (21), said loop forming switch (51), said CMOS variable delay circuit, and said 1/n divider circuit (90).

4. A delay time stabilization circuit as defined in claim 1, wherein said start pulse generation circuit (21) includes:

an oscillation circuit whose oscillation frequency is adjustable;

a register for storing a predetermined number n to generate said n pulses by said trigger pulse;

a counter for counting a number of pulses in an oscillation signal from said oscillation circuit; and a coincidence circuit for comparing an output of said counter with said number n from said register.

5. A delay time stabilization circuit as defined in claim 4, wherein said oscillation circuit includes an OR gate and a variable delay element wherein one input of said OR gate receives said trigger pulse and another input of said OR gate receives an output of said OR gate through said variable delay element.

6. A delay time stabilization circuit as defined in claim 5, wherein said oscillation frequency of said oscillation circuit is adjusted by regulating a delay time of said variable delay element.

* * * * *